(12) United States Patent
Royer et al.

(10) Patent No.: US 10,685,700 B2
(45) Date of Patent: Jun. 16, 2020

(54) PVT DETECTION CIRCUIT

(71) Applicant: Commissariat à l'Énergie Atomique et aux Énergies Alternatives, Paris (FR)

(72) Inventors: Pablo Royer, Grenoble (FR); Adam Makosiej, Grenoble (FR)

(73) Assignee: Commissariat à l'Énergie Atomique et aux Énergies Alternatives, Paris (FR)

(*) Notice: Subject to any disclaimer, the term of this patent is extended or adjusted under 35 U.S.C. 154(b) by 0 days.

(21) Appl. No.: 16/219,552

(22) Filed: Dec. 13, 2018

(65) Prior Publication Data

US 2019/0198092 A1    Jun. 27, 2019

(30) Foreign Application Priority Data

Dec. 22, 2017   (FR) .................................... 17 63173

(51) Int. Cl.

| | | |
|---|---|---|
| *G11C 5/14* | (2006.01) | |
| *G11C 11/417* | (2006.01) | |
| *H03K 19/003* | (2006.01) | |
| *G01R 19/165* | (2006.01) | |
| *G06F 1/3296* | (2019.01) | |

(52) U.S. Cl.
CPC ...... *G11C 11/417* (2013.01); *G01R 19/16552* (2013.01); *G11C 5/147* (2013.01); *H03K 19/00369* (2013.01); *G06F 1/3296* (2013.01)

(58) Field of Classification Search
CPC . G11C 11/417; G11C 5/147; G01R 19/16552; H03K 19/00369; G06F 1/3296

USPC ................................................ 365/227, 205
See application file for complete search history.

(56) References Cited

U.S. PATENT DOCUMENTS 4,482,824 A * 11/1984 Tzeng .................... G11C 17/12
                                                            327/51
5,892,389 A *  4/1999 Lai ........................ H01H 47/325
                                                            323/277
6,084,462 A *  7/2000 Barker ................... G01K 3/005
                                                            324/105

(Continued)

FOREIGN PATENT DOCUMENTS

WO      WO 98/36497 A1     8/1998
WO      WO 2010/079503 A2  7/2010

OTHER PUBLICATIONS

Preliminary Search Report for French Application No. 1763173, dated Aug. 2, 2018.

(Continued)

*Primary Examiner* — Viet Q Nguyen
(74) *Attorney, Agent, or Firm* — Wolf, Greenfield & Sacks, P.C.

(57) ABSTRACT

A PVT detection circuit including: first and second transistors of a first conduction type each having its control node coupled to a control line, the first and second transistors being configured such that the variations in their threshold voltages as a function of temperature and/or process are different from each other; and an amplifier coupled to a second main conducting node of each of the first and second transistors and configured to amplify a difference in the currents conducted by the first and second transistors in order to generate an output signal.

11 Claims, 5 Drawing Sheets

(56) References Cited

U.S. PATENT DOCUMENTS

| | | | | |
|---|---|---|---|---|
| 6,265,857 | B1* | 7/2001 | Demsky | G05F 3/245 |
| | | | | 323/312 |
| 6,789,939 | B2* | 9/2004 | Schrodinger | G01K 7/01 |
| | | | | 327/512 |
| 7,542,259 | B2* | 6/2009 | Ho | H02H 5/044 |
| | | | | 361/103 |
| 7,869,294 | B2* | 1/2011 | Kajigaya | G11C 7/067 |
| | | | | 365/194 |
| 8,159,262 | B1* | 4/2012 | Bhattacharya | H03K 19/00384 |
| | | | | 326/30 |
| 8,222,954 | B1* | 7/2012 | Ren | H03K 19/00369 |
| | | | | 323/312 |
| 8,300,484 | B2* | 10/2012 | Yoshida | G11C 7/04 |
| | | | | 365/194 |
| 8,410,772 | B1* | 4/2013 | Potluri | H03F 1/301 |
| | | | | 323/313 |
| 8,446,791 | B2* | 5/2013 | Pham | G11C 7/04 |
| | | | | 365/189.07 |
| 8,604,826 | B2* | 12/2013 | Cho | H03F 3/45183 |
| | | | | 323/312 |
| 8,693,264 | B2* | 4/2014 | Chand Sk | G11C 7/1057 |
| | | | | 365/189.05 |
| 8,797,695 | B2* | 8/2014 | Lescale | H01H 33/02 |
| | | | | 361/8 |
| 8,830,766 | B2* | 9/2014 | Sahu | G11C 7/065 |
| | | | | 365/189.05 |
| 9,344,305 | B2* | 5/2016 | Hekmat | H04L 25/4919 |
| 9,959,915 | B2* | 5/2018 | Desai | G11C 7/10 |
| 10,302,509 | B2* | 5/2019 | Pandiri | G01K 15/005 |
| 2007/0018172 | A1* | 1/2007 | Takahashi | C07D 239/96 |
| | | | | 257/77 |
| 2008/0117702 | A1 | 5/2008 | Henry et al. | |
| 2009/0079492 | A1* | 3/2009 | Wu | H03K 19/00369 |
| | | | | 327/509 |
| 2011/0074398 | A1 | 3/2011 | Barton et al. | |
| 2011/0298498 | A1 | 12/2011 | Wang et al. | |
| 2013/0258794 | A1* | 10/2013 | Sharad | G11C 7/08 |
| | | | | 365/205 |
| 2014/0307513 | A1* | 10/2014 | Chun | G11C 5/146 |
| | | | | 365/189.09 |
| 2015/0092477 | A1* | 4/2015 | Chiou | G11C 11/417 |
| | | | | 365/154 |
| 2015/0178048 | A1 | 6/2015 | Burleson et al. | |
| 2016/0020758 | A1* | 1/2016 | Kim | H03K 5/134 |
| | | | | 327/103 |
| 2016/0301400 | A1 | 10/2016 | Savidis et al. | |
| 2019/0019560 | A1* | 1/2019 | Jeong | G11C 16/24 |

OTHER PUBLICATIONS

Balabanyan et al., Fully integrated PVT detection and impedance self-calibration system design. Proc. XXV International Scientific Conference Electronics—ET2016. 2016:1-4.

Chang et al., Near-/Sub-$V_{th}$ process, voltage, and temperature (PVT) sensors with dynamic voltage selection. 2013 IEEE International Symposium on Ciruits and Systems (ISCAS). 2013:133-6.

Chen et al., Fully on-chip temperature, process, and voltage sensors. 2010 IEEE International Symposium on Circuits and Systems (ISCAS). 2010:897-900.

Chung et al., An all-digital voltage sensor for static voltage drop measurements. 2016 IEEE Sensors Applications Symposium (SAS). 2016:1-4.

Khan et al., Techniques for on-chip process voltage and temperature detection and compensation. IEEE Proceedings of the 19th International Conference on VLSI Design (VLSID '06). 2006:1-6.

Melikyan et al., PVT variation detection and compensation methods for high-speed systems. Proceedings of 2013 IFIP/IEEE 21st International Conference on Very Large Scale Integration (VLSI-SoC). 2013:322-7.

Raychowdhury et al., PVT-and-aging adaptive wordline boosting for 8T SRAM power reduction. 2010 IEEE International Solid-State Circuits Conference (ISSCC). 2010:352-4.

Sebastian et al., PVT-aware digital techniques for a power line energy-harvesting sensor node. 2016 IEEE International Symposium on Circuits and Systems (ISCAS). 2016:1958-1961.

Tadeparthy, A CMOS bandgap reference with correction for device-to-device variation. 2004 IEEE International Symposium on Circuits and Systems (ISCAS). 2004:397-400.

FR1763173, Aug. 2, 2018, Preliminary Search Report.

* cited by examiner

PVT DETECTION CIRCUIT

CROSS-REFERENCE TO RELATED APPLICATIONS

This application claims the priority benefit of French patent application number 17/63173, filed on Dec. 22, 2017, the content of which is hereby incorporated by reference in its entirety to the maximum extent allowable by law.

FIELD

The present disclosure relates to the field of dynamic voltage scaling, and in particular to a circuit and method for detecting PVT (process, voltage, temperature) conditions in an integrated circuit.

BACKGROUND

The energy consumption of an integrated circuit can be reduced by dynamically reducing the supply voltage when the operating mode permits such a reduction. Indeed, reducing the supply voltage has an effect on the performance of the circuit, reducing the maximum frequency at which the circuit is capable of operating. By dynamically controlling the supply voltage and the operating frequency of the circuit, a trade-off between energy consumption and performance can be achieved based on the particular needs of the operating mode.

The PVT point of a circuit corresponds to levels of the three main parameters that influence performance: process, voltage and temperature. If the PVT point of a circuit can be estimated at any given time, this allows the transistor speed to be deduced, and thus the operating frequency and/or supply voltage can be set in order to achieve a desired performance.

Solutions exist for estimating the PVT point. For example, some solutions are based on ring oscillators that generate an oscillating signal at a frequency that depends on the PVT point. However, such circuits tend to be complex and slow, occupy a relatively large chip area and have relatively high energy consumption.

An example of a circuit for which an estimation of the PVT point would be beneficial is an SRAM (static random access memory). Indeed, it has been proposed to provide voltage assistance techniques to permit read and write operations to an SRAM to be performed successfully in the presence of very low supply voltage levels. However, such techniques are only useful in the case that the supply voltage within the circuit is not sufficiently high to support standard operation. The activation of the voltage assistance techniques is generally performed by an external circuit, which has relatively imprecise information regarding the PVT point within the SRAM. Furthermore, the use of an external circuit requires I/O (input/output) pins, whereas it is generally desirable to limit the number of pins.

SUMMARY

It is an aim of embodiments of the present description to at least partially address one or more problems in the prior art.

According to one aspect, there is provided a PVT detection circuit comprising: first and second transistors of a first conduction type each having its control node coupled to a control line and a first of its main conducting nodes coupled to a first voltage rail, wherein the first and second transistors are configured such that the variations in their threshold voltages as a function of temperature and/or process are different from each other; and an amplifier coupled to a second main conducting node of each of the first and second transistors and configured to amplify a difference in the currents conducted by the first and second transistors in order to generate an output signal at an output of the circuit.

According to one embodiment, the amplifier comprises: a bi-stable latch; and a pre-charge circuit configured to place the bi-stable latch in a metastable state.

According to one embodiment, the bi-stable latch comprises first and second inverters cross-coupled between first and second voltage nodes, the first inverter being coupled to the first voltage rail via the second main conducting node of the first transistor, and the second inverter being coupled to the first voltage rail via the second main conducting node of the second transistor.

According to one embodiment, the PVT detection circuit further comprises: third and fourth transistors of a second conduction type each having its control node coupled to a further control signal and a first of its main conducting nodes coupled to a second reference voltage rail, a second main conducting node of each of the third and fourth transistors being coupled to the amplifier, the third and fourth transistors being configured to have different threshold voltages from each other and a different rate of variation of their threshold voltages with respect to at least one of process and temperature variations.

According to one embodiment, the PVT detection circuit further comprises the above third and fourth transistors, the first inverter being coupled to the second voltage rail via the second main conducting node of the third transistor and the second inverter being coupled to the second voltage rail via the second main conducting node of the fourth transistor.

According to one embodiment, the first and second transistors are configured to be different from each other in one or more of the following aspects: the transistor length; the transistor width; the transistor type; and the level of the body biasing voltage.

According to a further aspect, there is provided a PVT detection system comprising: a first of the above PVT detection circuit; and a second of the above PVT detection circuit, the first and second transistors of the first PVT detection circuit being configured to have threshold voltages that are each different from the threshold voltages of the first and second transistors of the second PVT detection circuit.

According to one embodiment, the first and second PVT detection circuits are coupled in series with each other, the output of the first PVT detection circuit being coupled to the control line of the second PVT detection circuit.

According to one embodiment, the PVT detection system further comprises a third of the above PVT detection circuit having its control line coupled to a complimentary output of the first PVT detection circuit.

According to a further aspect, there is provided a three-dimensional circuit comprising a plurality of integrated circuit levels, each of said levels comprising one of the above PVT detection circuit.

According to a further aspect, there is provided a method for detecting a PVT point comprising: activating first and second transistors of a first conduction type via a control line coupled to control nodes of the first and second transistors, each of the first and second transistors having a first of its main conducting nodes coupled to a first voltage rail, and the first and second transistors being configured such that the variations in their threshold voltages as a function of temperature and/or process are different from each other; and amplifying a difference in the currents conducted by a second main conducting node of each of the first and second transistors in order to generate an output signal.

BRIEF DESCRIPTION OF THE DRAWINGS

The foregoing and other features and advantages will become apparent from the following detailed description of embodiments, given by way of illustration and not limitation with reference to the accompanying drawings, in which.

DETAILED DESCRIPTION

Throughout the following description the term "connected" is used to designate a direct electrical connection between circuit elements, whereas the term "coupled" is used to designate an electrical connection that may be direct, or may be via one or more intermediate elements, such as resistors, capacitors or transistors.

Figure 1:
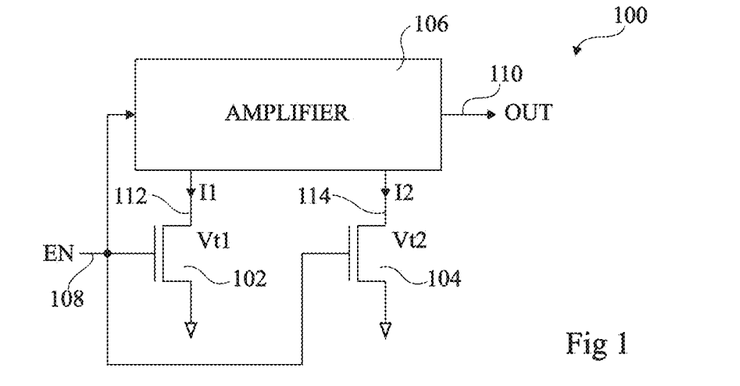
FIG. 1 schematically illustrates a PVT detection circuit according to an example embodiment of the present disclosure.

FIG. 1 schematically illustrates a PVT detection circuit 100 according to an example embodiment.

The circuit 100 for example comprises transistors 102 and 104, each coupled by its main conducting nodes between a reference voltage rail, in this case the ground rail, and corresponding inputs of an amplifier (AMPLIFIER) 106. In the example of FIG. 1, each of transistors 102, 104 is an n-channel MOS transistor having main conducting nodes corresponding to its source and drain, although in alternative embodiments the transistors could be replaced by other types of devices. In some embodiments the transistors 102, 104 are SOI (silicon on insulator) devices, for example of the type known as FD-SOI (fully-depleted SOI).

Each of the transistors 102, 104 has its control node, for example its gate, coupled to a control line 108 on which is provided an enable signal EN. Thus each of the transistors 102, 104 behaves as a current source that receives an identical control voltage EN on the control line 108. The control line 108 is also for example coupled to the amplifier 106, which generates an output signal OUT on an output 110.

The transistors 102 and 104 are configured to have different threshold voltages Vt1 and Vt2 respectively. Furthermore, the transistors 102 and 104 are configured such that one of these transistors is dominant below a given VGS threshold, and the other of the transistors is dominant above this VGS threshold. In other words, the variations of the drain/source currents IDS of the transistors 102, 104 with respect to their gate source voltage VGS vary such that at the VGS threshold, the IDS currents of the two transistors 102, 104 are equal. Furthermore, the transistors 102, 104 are configured such that the variations in their threshold voltages as a function of temperature and/or process are different from each other, and thus the VGS threshold shifts as a function of process and/or temperature, as will be described in more detail below.

In operation, the enable signal EN is for example at the supply voltage VDD of the circuit when asserted, and will cause the transistors 102 and 104 to conduct currents I1 and I2 on input lines 112 and 114 of the amplifier respectively. The amplifier 106 for example generates the output signal OUT, which is for example a binary voltage signal, based on the relative levels of the currents I1 and I2. For example, the signal OUT is high when the current I1 is greater than the current I2, and low when the current I2 is greater than the current I1, although the opposite could be true.

Figure 2:
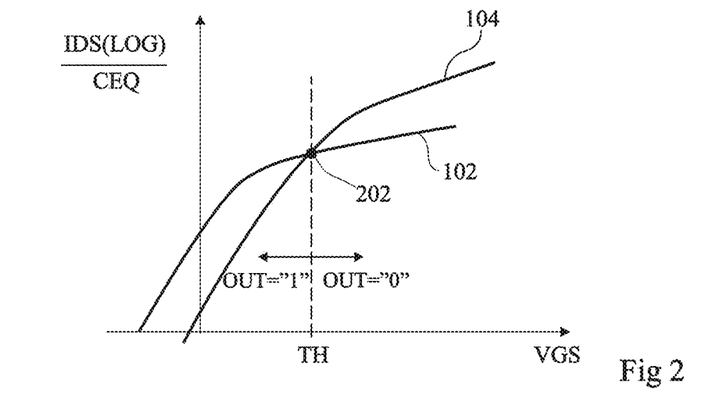
FIG. 2 is a graph illustrating an example of the conduction of transistors of the circuit of FIG. 1 under varying VGS voltages according to an example embodiment.

FIG. 2 is a graph representing an example of variations of the current IDS(log)/CEQ of each of the transistors 102, 104 of FIG. 1 as a function of the VGS voltage, where CEQ is the capacitance present at the drains of the transistors 102, 104. As illustrated, the curves of FIG. 2 cross at a point 202 corresponding to the VGS threshold TH described above. At this point 202, the IDS current of each transistor 102, 104 relative to the corresponding capacitance CEQ is equal, in other words IDS1/CEQ1=IDS2/CEQ2, where IDS1 and IDS2 are the drain-source currents of the transistors 102 and 104 respectively, and CEQ1 and CEQ2 are the capacitances at the drains of the transistors 102 and 104 respectively. In the example of FIG. 2, when the VGS voltage is below the threshold TH, the current generated by the transistor device 102 is dominant, and thus the signal OUT is for example high, whereas when the VGS voltages is above the threshold TH, the current generated by the transistor 104 is dominant, and thus the signal OUT is for example low.

Thus the signal OUT provides an indication of the level of the VGS voltage applied to the transistors with respect to the threshold TH, and given that the threshold TH varies with temperature and/or process, it also indicates whether a PVT threshold has been exceeded. For example, the transistors 102, 104 are configured such that, when the VGS voltage, and thus the supply voltage VDD of the circuit, is above the variable threshold TH, the supply voltage is high enough to meet a certain performance criteria. For example, in the case that the PVT detection circuit 100 is implemented in an SRAM, the threshold TH corresponds to a level above which read and write operations can be performed without boosting the voltages using read or write assist techniques.

Figure 3A:
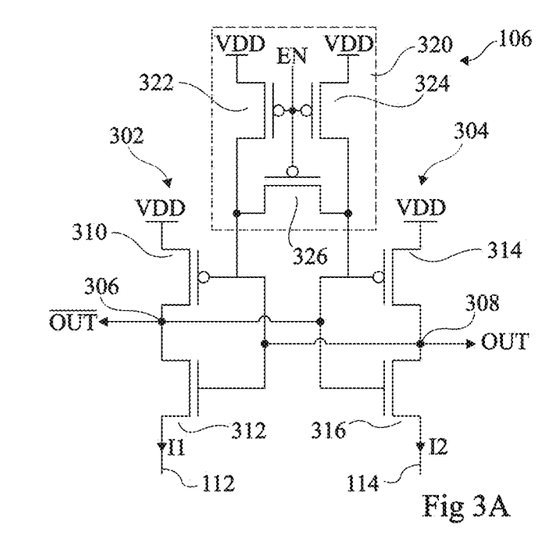
FIG. 3A illustrates an amplifier of the circuit of FIG. 1 in more detail according to an example embodiment.

FIG. 3A schematically illustrates an example implementation of the amplifier 106.

The amplifier 106 for example comprises a bi-stable latch formed by inverters 302 and 304 cross-coupled between voltage nodes 306 and 308. The inverter 302 is for example formed by a PMOS transistor 310 and an NMOS transistor 312 coupled in series by their source/drain nodes between the voltage supply rail VDD and the line 112. Similarly, the inverter 304 is for example formed by a PMOS transistor 314 and an NMOS transistor 316 coupled in series by their source/drain nodes between the voltage supply rail VDD and the line 114. The gates of the transistors 314 and 316 are coupled to the voltage node 306, and the gates of the transistors 310 and 312 are coupled to the voltage node 308. The node 308 for example provides the output signal OUT of the amplifier 106. The node 306 for example provides the complementary version $\overline{OUT}$ of the signal OUT.

The amplifier 106 also comprises a pre-charge circuit 320, which for example comprises PMOS transistors 322 and 324, respectively coupling the nodes 308 and 306 to the supply voltage rail VDD, and a PMOS transistor 326, coupling the nodes 306 and 308 together. The PMOS transistors 322, 324 and 326 are for example controlled by the enable signal EN.

Figure 3B:
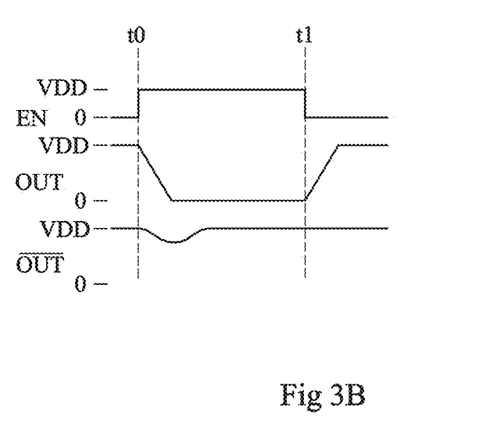
FIG. 3B is a timing diagram representing examples of signals in the circuit of FIG. 3A according to an example embodiment.

FIG. 3B is a timing diagram representing an example of the enable signal EN, the output signal OUT at the node 308 and the signal $\overline{OUT}$ at the node 306 of FIG. 3A.

The enable signal EN is initially low, causing the nodes 306 and 308 of the amplifier 106 to be coupled to the supply voltage rail VDD, and thereby placing the latch formed by the inverters 302, 304 in a metastable state.

At a time t0, the enable signal EN is asserted, thereby freeing the nodes 306, 308, and activating the transistors 102 104. In the example of FIG. 3B, the PVT point of the circuit causes the transistor 104 to conduct a higher current IDS with respect to its capacitance CEQ than the transistor 102, and thus the voltage on the line 114 is brought low faster than the voltage on the line 112. Thus the signal OUT at the node 308 falls more quickly than the signal $\overline{OUT}$ at the node 306, which only dips and then returns to the supply level VDD. Thus the output signal OUT is low. At a time t1, the enable signal EN for example goes low, causing the voltage signal OUT at the node 308 to return to a level close to the supply voltage VDD.

Figure 4A:
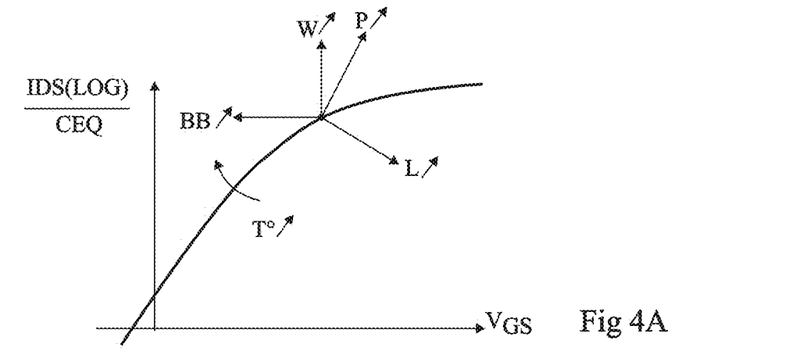
FIG. 4A is a graph representing the effect of transistor parameters on the behaviour of a transistor.

FIG. 4A is a graph showing a curve of IDS(log)/CEQ variations with respect to the VGS voltage of a transistor, and represents the influence of various parameters on this curve.

A temperature increase for example causes a clockwise rotation of the curve. A variation in the process in the direction of a fast-fast process corner for example causes the curve to shift up and to the right, in other words the current for a given VGS voltage will increase.

Other parameters indicated in FIG. 4A correspond to parameters of the transistors 102, 104 that can be selected to achieve a desired variation in the threshold TH as a function of temperature and/or process variations. For example, when the transistor width W is increased, the IDS current also increases for any given VGS voltage. Furthermore, an increase in the transistor length L causes the curve to shift down and to the right, such that less current is provided for any given VGS level. An increase in the body biasing voltage BB for example causes the curve to shift to the left, thereby increasing the current for any given VGS voltage.

Other design parameters of the transistors 102, 104, in addition to or instead of those represented in FIG. 4A, could be used to achieve a desired variation in the threshold TH as a function of temperature and/or process variations, such as the transistor type (LVT, RVT or HVT), gate oxide thickness (GO1, GO2 or GO3), etc.

An example of how the VGS threshold TH can be rendered temperature dependent will now be described with reference to FIG. 4B.

Figure 4B:
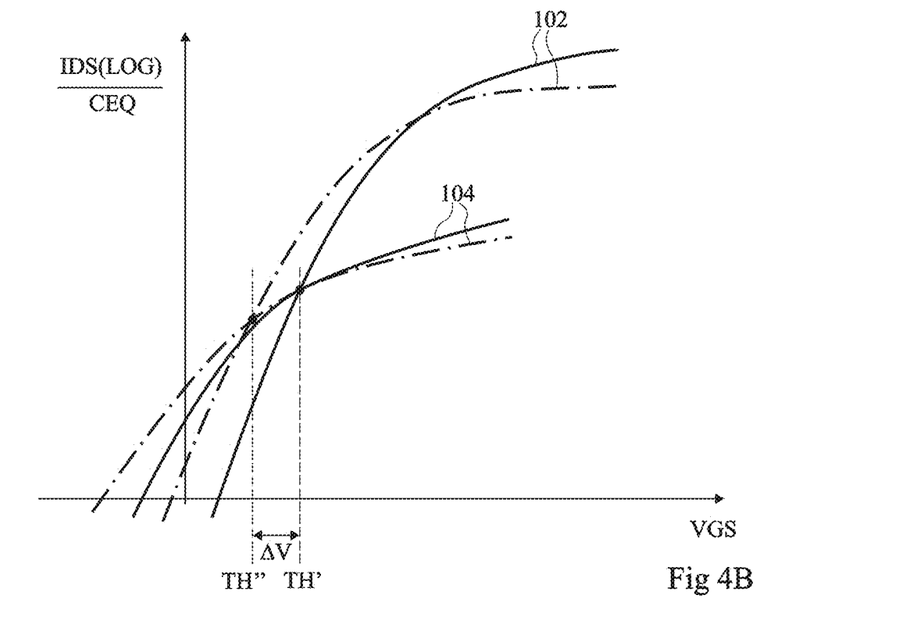
FIG. 4B is a graph illustrating an example of the behaviour of transistors of the circuit of FIG. 1 at two different temperatures according to an example embodiment.

FIG. 4B is a graph showing curves of IDS(log)/CEQ variations with respect to the VGS voltage of the transistors 102, 104 at two different temperatures. In particular, solid lines in FIG. 4B represent the curves for a first temperature of each of the transistors 102, 104, and dashed-dotted lines represent the curves for a second temperature of each of the transistors 102, 104, the second temperature being higher than the first temperature.

It can be seen that at the first temperature, the curves of the transistors 102, 104 cross at a VGS threshold TH', while at the second temperature, the curves of the transistors 102, 104 cross at a lower VGS threshold TH". This is for example achieved by making the transistor 102 wider than the transistor 104, and applying a body biasing voltage to the transistor 104, such that the rotation of the curves caused by the temperature change of the transistor 102 causes the crossing point of its curve to shift along the curve of the transistor 104.

The parameters of the transistors 102, 104 can additionally or alternatively be selected to cause the threshold TH to be dependent on process variations.

Figure 5:
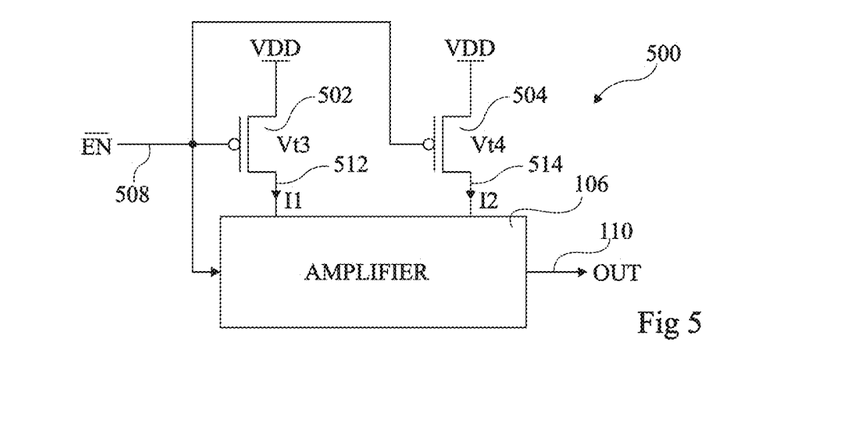
FIG. 5 schematically illustrates a PVT detection circuit according to a further example embodiment.

FIG. 5 schematically represents a PVT detection circuit 500 according to a further example embodiment. The circuit 500 is similar to the circuit 100 of FIG. 1, and like features are labelled with like reference numerals and will not be described again in detail. However, in the example of FIG. 5, the NMOS transistors 102 and 104 are replaced by PMOS transistors 502, 504, respectively having different threshold voltages Vt3 and Vt4. Thus while the embodiment of FIG. 1 will be particularly sensitive to NMOS process variations, the embodiment of FIG. 5 will be particularly sensitive to PMOS process variations. The PMOS transistors 502, 504 for example have their gates coupled to a control line 508 for receiving the inverse of the enable signal $\overline{EN}$. The PMOS transistors 502 and 504 are for example coupled between the VDD supply voltage rail and inputs 512, 514 respectively of the amplifier 106. The input line 508 is also for example coupled to the amplifier 506.

Like the transistors 102 and 104, the transistors 502 and 504 are configured such that one of these transistors is dominant below a given VGS threshold, and the other of the transistors is dominant above this VGS threshold. In other words, the variations of the drain/source currents IDS of the transistors 502, 504 with respect to their gate source voltage VGS vary such that at the VGS threshold, the IDS currents of the two transistors 502, 504 relative to their corresponding CEQ capacitances are equal, in other words IDS3/CEQ3=IDS4/CEQ4, where IDS3 and IDS4 are the drain-source currents of the transistors 502 and 504 respectively, and CEQ3 and CEQ4 are the capacitances at the drains of the transistors 502 and 504 respectively. Furthermore, the transistors 502, 504 are configured such that the variations in their threshold voltages as a function of temperature and/or process are different from each other, and thus the VGS threshold shifts as a function of process and/or temperature.

Operation of the circuit of FIG. 5 is similar to that of FIG. 1. The amplifier 106 of FIG. 5 is for example implemented by a circuit similar to that of FIG. 3A, except that the inverters 302 and 304 are coupled to the VDD voltage rail via the transistors 502 and 504 respectively, and the pre-charge circuit 320 will couple the nodes 306 and 308 to ground.

Figure 6:
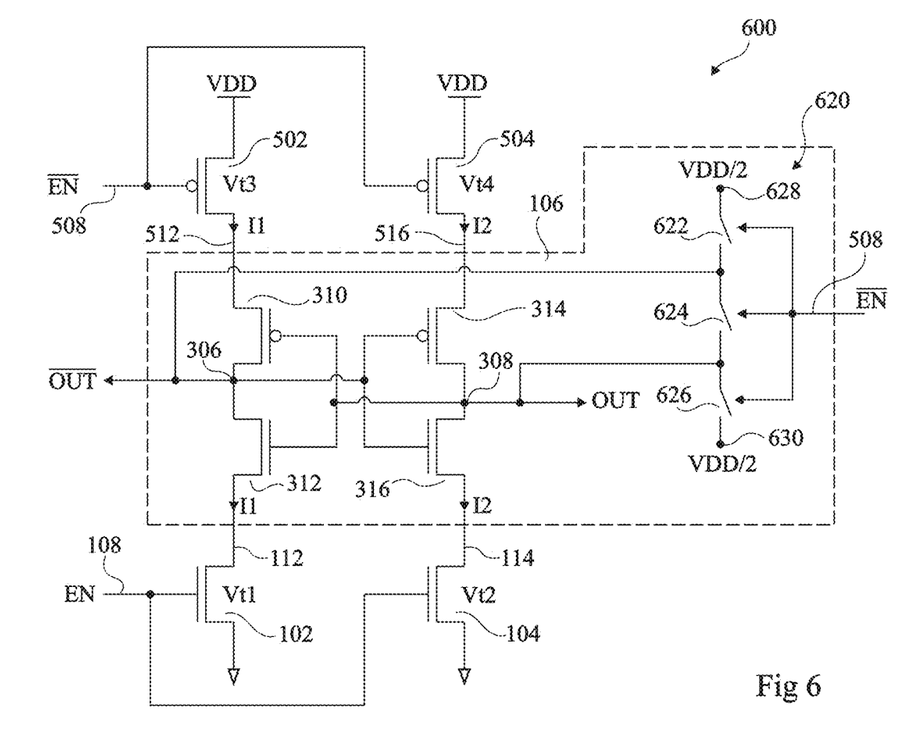
FIG. 6 schematically illustrates a PVT detection circuit according to a further example embodiment.

FIG. 6 schematically illustrates a PVT detection circuit 600 according to yet a further example embodiment. The example of FIG. 6 combines the embodiments of FIGS. 1 and 5 by providing the transistors 102, 104 coupled between the amplifier 106 and the ground rail, and the transistors 502 and 504 coupled between the amplifier 106 and the VDD voltage rail.

The amplifier 106 of FIG. 6 is similar to the amplifier 106 of FIG. 3A, except that the pre-charge circuit 320 is replaced in FIG. 6 by a pre-charge circuit 620, which pre-charges the voltage nodes 306 and 308 to VDD/2. The pre-charge circuit 620 for example comprises switches 622, 624 and 626 coupled in series between nodes 628 and 630, each of the nodes 628 and 630 being at the supply voltage VDD/2. The intermediate node between the switches 622 and 624 is coupled to the node 306 of the amplifier 106, and the intermediate node between switches 624 and 626 is coupled to the voltage node 308 of the amplifier 106. The switches 622, 624 and 626 are controlled by the inverse $\overline{EN}$ of the enable signal EN received on the control line 508.

In operation, in the circuit of FIG. 6, the current I1 is conducted by both the transistors 502 and 102, and the current I2 in the circuit of FIG. 6 is conducted by both the transistors 504 and 104. Thus the PVT detection circuit 600 of FIG. 6 is sensitive to variation to both PMOS and NMOS transistors. Furthermore, the number of design parameters available for obtaining a desired temperature and process response is increased with respect to a circuit having just two NMOS or two PMOS transistors.

Figure 7A:
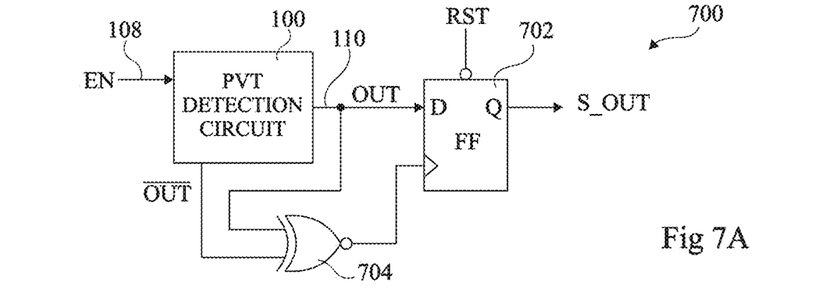
FIG. 7A schematically illustrates a PVT detection circuit according to yet an example embodiment.

FIG. 7A schematically illustrates a PVT detection circuit 700 comprising the circuit 100 of FIG. 1 and an output circuit for formatting the output signal. In the example of FIG. 7A, the output 110 of the circuit 100 is coupled to a data input D of a flip-flop 702. An XOR gate 704 has one input coupled to the output 110, and a further input coupled to the complementary output of the circuit 100 for receiving the signal $\overline{OUT}$. The output of the XOR gate 704 is coupled to a clock input of the flip-flop 702. The flip-flop 702 is for example reset by a reset signal RST, and provides at its Q output a signal S_OUT of the circuit 700. An advantage of the implementation of FIG. 7A is that a transition of either of the signals OUT and $\overline{OUT}$ is used to time the refresh of the output signal S_OUT.

Figure 7B:
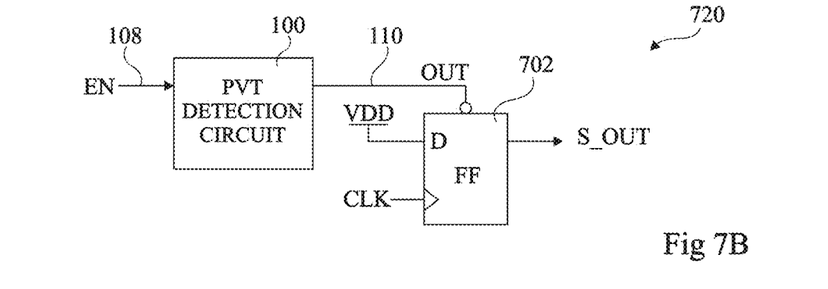
FIG. 7B schematically illustrates a PVT detection circuit according to yet a further example embodiment.

FIG. 7B schematically illustrates a PVT detection circuit 720 comprising the circuit 100 of FIG. 1 and an output circuit comprising a flip-flop 702 having its reset input coupled to the output 110 of the circuit 100. The data input D of flip-flop 702 is coupled to the supply voltage VDD, and the clock input for example receives a clock signal CLK. In operation, the output signal S_OUT of the circuit 720 will be at VDD by default, but will be at zero if the flip-flop 702 is reset by the output signal OUT of the PVT detection circuit 100.

Of course, the circuit 100 in FIGS. 7A and 7B could be replaced in alternative embodiments by the circuit 500 of FIG. 5 or the circuit 600 of FIG. 6.

Figure 8:
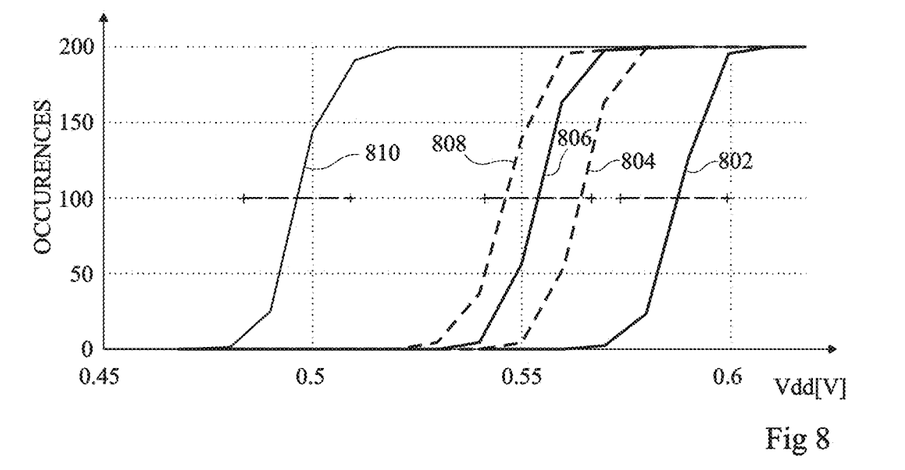
FIG. 8 is a graph representing triggering occurrences of the PVT detection circuit of FIG. 1 according to an example embodiment.

FIG. 8 is a graph representing an example of the number of occurrences (OCCURENCES), represented by a cumulative distribution function, of the triggering of the PVT detection circuit 100 for a range of supply voltage levels. A curve 802 represents an SS (slow slow) process corner, a curve 804 represents an SF (slow fast) process corner, a curve 806 represents a TT (typical typical) process corner, a curve 808 represents an FS (fast slow) process corner and a curve 810 represents an FF (fast fast) process corner.

It can be seen from the curves of FIG. 8 that, in view of a certain mismatch between the devices 102 and 104, the circuit may be triggered at a value falling within a range of voltages. For example, in the case of the SS corner represented by the curve 802, some circuits triggered at a VDD supply voltage as low as 0.57 V. It is for example verified that the lowest triggering voltage for each process corner is high enough to meet a desired level of performance for triggering a given operation by the PVT detection circuit 100.

Figure 9A:
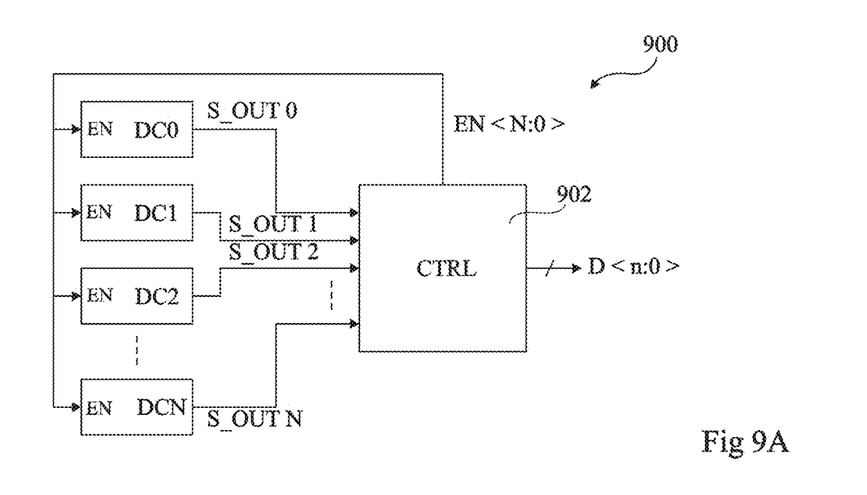
FIG. 9A schematically illustrates a PVT detection system comprising a plurality of PVT detection circuits according to an example embodiment.

FIG. 9A schematically illustrates a PVT detection system 900 comprising N+1 PVT detection circuits DC0 to DCN, each for example corresponding to the circuit 700 or 720 of FIGS. 7A and 7B. The circuits DC0 to DCN generate output signal S_OUT0 to S_OUTN respectively, and these signals are for example provided to a control circuit (CTRL) 902, which for example generates an n-bit output signal D<n:0> based on the output signals S_OUT0 to S_OUTN, where n is for example an integer, equal for example to between 1 and N+1 depending on the filtering applied to the output signals S_OUT0 to S_OUTN. The control circuit 902 for example generates an enable signal EN for controlling each of the PVT detection circuits, which may for example be activated in parallel, or one by one.

In some embodiments, the PVT detection circuits DC0 to DCN of FIG. 9A are distributed to detect gradients in the PVT point, such as gradients resulting from temperature gradients at certain points in a circuit, process variation gradients, or VDD voltage gradients resulting for example from an IR drop.

Alternatively, each of the PVT detection circuits DC0 to DCN of FIG. 9A for example has a VGS threshold TH at a different level for a given process/temperature point, and thus the system 900 for example permits a more precise estimation of the PVT operating point.

As yet a further example, each of the PVT detection circuits DC0 to DCN is configured to take a different decision regarding the operation of a circuit. For example, in the case of an SRAM, one or more of the detection circuits is used to trigger the application of a negative voltage NBL on one of the bit lines during a write operation, and one or more different detection circuits are used to select a particular dummy path in the SRAM. As known by those skilled in the art, a dummy path may comprise a dummy bitline discharged by a reference cell, and can be used to estimate the read time in the memory array and thus optimize the timing of the access operations. More than one dummy path may be provided, each configured for a different PVT point, and one of these dummy paths can be selected based on the output of one or more PVT detection circuits. Additionally or alternatively, one or more PVT detection circuits could be used to control the activation of a word line boost voltage.

Figure 9B:
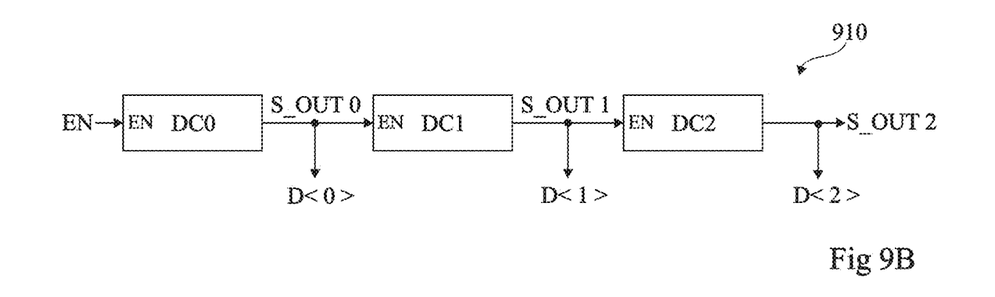
FIG. 9B illustrates a PVT detection system comprising a priority of the PVT detection circuits according to a further example embodiment.

FIG. 9B schematically illustrates a PVT detection system 910 according to a variation to that of FIG. 9A, in which three PVT detection circuits DC0 to DC2 are coupled in series, and only the first circuit DC0 is enabled directly, the circuit DC1 being selectively enabled by the result of the detection by the circuit DC0 and the circuit DC2 being selectively enabled by the result of the detection by the circuit DC1. For example, the circuit DC0 has a VGS threshold TH0, the circuit DC1 has a VGS threshold TH1 higher than TH0, and the circuit DC2 has a VGS threshold TH2 higher than TH1. The output of the circuit DC0 is coupled to the enable input of the circuit DC1, and the output of the circuit DC1 is coupled to the enable input of the circuit DC2. The output signals S_OUT0, S_OUT1 and S_OUT2 respectively provide output bits D<0>, D<1> and D<2> of the system 910, where the following readings are for example obtained based on the range of VDD:

| D<2:0> | VDD |
|---|---|
| 111 | TH2 < VDD |
| 011 | TH1 < VDD < TH2 |
| 001 | TH0 < VDD < TH1 |
| 000 | VDD < TH0 |

Figure 9C:
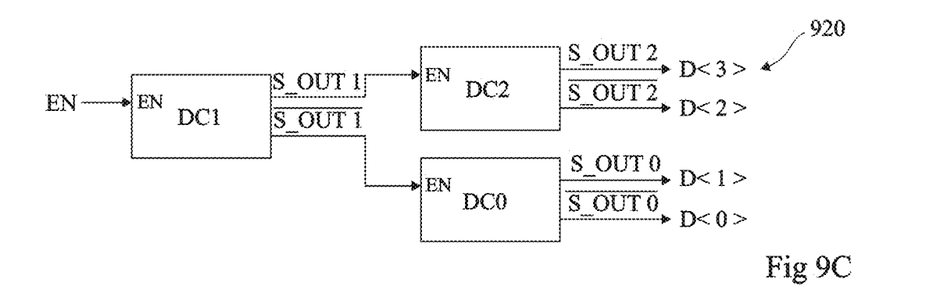
FIG. 9C schematically illustrates a PVT detection system comprising a plurality of PVT detection circuits according to yet a further example embodiment.

FIG. 9C schematically illustrates a PVT detection system 920 according to a variation to that of FIGS. 9A and 9B, in which PVT detection circuits DC0, DC1 and DC2 are connected in a tree arrangement. In particular, the circuit DC1 provides output signals S_OUT1 and $\overline{\text{S\_OUT1}}$, which are respectively provided to the enable inputs of the circuits DC0 and DC2. For example, the circuit DC0 has a VGS threshold TH0, the circuit DC1 has a VGS threshold TH1 higher than TH0, and the circuit DC2 has a VGS threshold TH2 higher than TH1. Output signals $\overline{\text{S\_OUT0}}$ and S_OUT0 of the circuit DC0, and the output signals $\overline{\text{S\_OUT2}}$ and S_OUT2 of the circuit DC2, respectively provide output bits D<0> to D<3> of the system 920, where the following readings are for example obtained based on the range of VDD:

| D<3:0> | VDD |
|---|---|
| 1000 | TH2 < VDD |
| 0100 | TH1 < VDD < TH2 |
| 0010 | TH0 < VDD < TH1 |
| 0001 | VDD < TH0 |

While the examples of FIGS. 9B and 9C illustrate simple examples having three detection circuits, it will be apparent to those skilled in the art that these embodiments could be adapted to include any number of detection circuits in a series or tree arrangement.

The arrangements of the PVT detection circuits as described in relation with FIGS. 9B and 9C provide advantages in terms of energy consumption, latency and/or bit format.

For example, the energy consumption will depend on the number of detection circuits that are activated for a given detection operation. In the case of the series arrangement of FIG. 9B, the number of activated detection circuits will be between 1 and N depending on the level of the supply voltage, where N is the number of detection circuits. In the case of the tree arrangement of FIG. 9C, there will always be $2*\log_2(N+1)$ activations in the case of N detection circuits (two activations in the example of FIG. 9C comprising three circuits), and thus a constant energy consumption, independently of the value being measured.

Likewise, latency will be variable in the series arrangement of FIG. 9A between 1 and N times the latency of a single detection circuit. In the tree arrangement of FIG. 9C, the latency will always be $2*\log_2(N+1)$ times the latency of a single detection circuit (twice the latency in the example of FIG. 9C comprising three circuits).

Figure 10A:
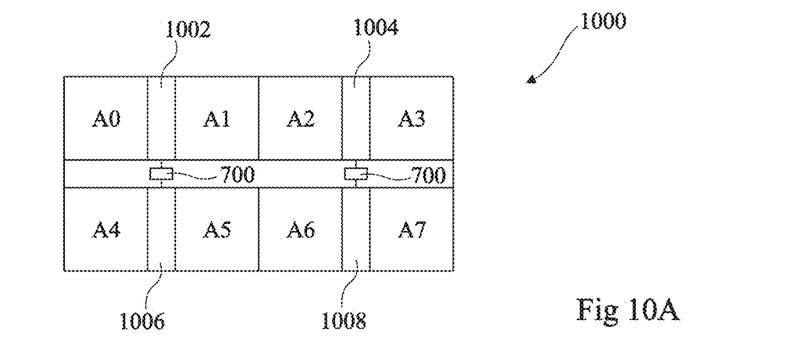
FIG. 10A schematically illustrates a memory array comprising PVT detection circuits according to an example embodiment.

FIG. 10A schematically illustrates a memory device 1000 comprising PVT detection circuits according to an example embodiment. The memory device 1000 is for example an SRAM comprising eight arrays A0 to A7 arranged in two rows of four arrays, the arrays A0 and A1 sharing control circuitry 1002, the arrays A2 and A3 sharing control circuitry 1004, the arrays A4 and A5 sharing control circuitry 1006, the arrays A6 and A7 sharing control circuitry 1008. Two PVT detection circuits 700, each for example similar to that of FIG. 7A, are positioned in a circuit region between the two rows of memory arrays, and for example detect when read and/or write assistance can be turned off. The circuits 700 for example provide corresponding control signals to the circuits 1002, 1004, 1006 and 1008 to control the read and write assist operations accordingly.

Figure 10B:
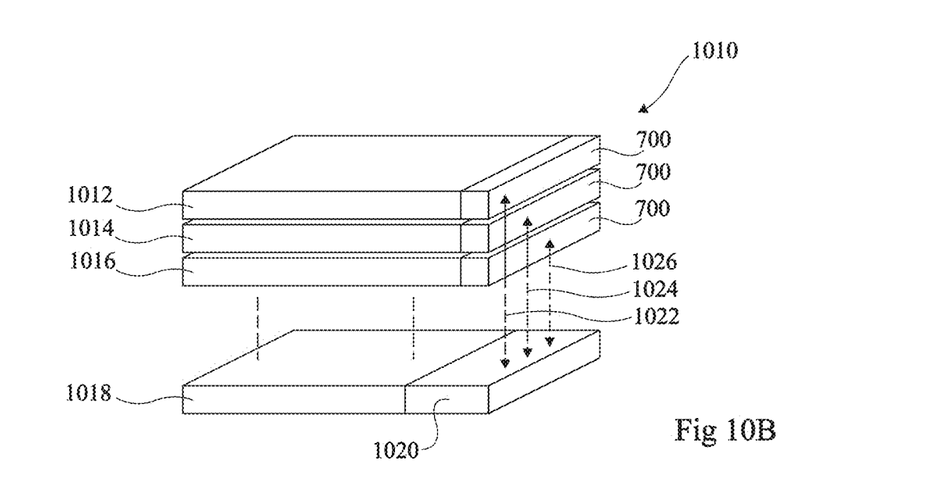
FIG. 10B is a perspective view of a 3D circuit comprising PVT detection circuits according to an example embodiment.

FIG. 10B schematically illustrates a 3D integrated circuit 1010 comprising a PVT detection system. The 3D circuit 1010 for example comprises a plurality of levels, four being shown labelled 1012, 1014, 1016 and 1018 in FIG. 10B. In some embodiments, the 3D circuit 1010 is a monolithic circuit. Some or all of the levels comprise PVT detection circuits 700 similar to that of FIG. 7A, and the level 1018 for example comprises a control circuit 1020 that communicates with each of the PVT detection circuits 700 of the levels 1012 to 1016 using vias 1022 to 1026 respectively. For example, the control circuit 1020 activates the PVT detection circuits 700 by generating corresponding enable signals, and receives one or more signals from each of the PVT detection circuits 700 indicating the PVT point of the corresponding level. The VDD supply voltage level of each level can then for example be controlled accordingly.

An advantage of providing a PVT detection circuit on each level of a 3D structure as shown in FIG. 10B is that process and temperature variations between the layers, and any IR drop, can be taken into account in order to independently set the supply voltage of each level.

An advantage of the PVT detection circuit as described herein based on two or more current sources is that the solution is compact, rapid and has relatively low energy consumption.

Having thus described at least one illustrative embodiment, various alterations, modifications and improvements will readily occur to those skilled in the art. For example, while embodiments have been described based on MOS transistor technology, it will be apparent to those skilled in the art that the principles described herein could be applied to other transistor technologies, such as bipolar technology.

Furthermore, it will be apparent to those skilled in the art that while examples of the amplifier and pre-charge circuits have been described, there are many variations and alternatives that could be used. For example, in addition to, or instead of, the pre-charge circuit 320, a pre-charge circuit could be arranged to pre-charge the nodes 112 and 114 directly. For example, the nodes 112 and 114 are coupled together and to the VDD rail via PMOS transistors controlled by the enable signal EN. An advantage of providing a pre-charge circuit connected directly to the nodes 112 and 114 is that these nodes can be pre-charged faster than if they are pre-charged via the transistors 312 and 316 of the amplifier 106.

Furthermore, the various features described in relation with the various embodiments can be combined, in alternative embodiments, in any combination.

What is claimed is:

1. A PVT detection circuit comprising:
   first and second transistors of a first conduction type each being controlled by a control voltage applied to its gate, the gates of the first and second transistors being coupled to a control line and a first main conducting node of each of the first and second transistors being coupled to a first voltage rail, wherein the first and second transistors are configured to operate as current sources controlled by the control voltage on the control line, and the first and second transistors are configured such that the variations in their threshold voltages as a function of at least one of temperature or manufacturing process are different from each other; and an amplifier coupled to a second main conducting node of each of the first and second transistors and configured to amplify a difference in the currents conducted by the first and second transistors in order to generate an output signal at an output of the circuit.

2. The PVT detection circuit of claim 1, wherein the amplifier comprises:
   a bi-stable latch; and
   a pre-charge circuit configured to place the bi-stable latch in a metastable state.

3. The PVT detection circuit of claim 2, wherein the bi-stable latch comprises first and second inverters cross-coupled between first and second voltage nodes, the first inverter being coupled to the first voltage rail via the second main conducting node of the first transistor, and the second inverter being coupled to the first voltage rail via the second main conducting node of the second transistor.

4. The PVT detection circuit of claim 1, further comprising:
   third and fourth transistors of a second conduction type each having its control node coupled to a further control signal and a first of its main conducting nodes coupled to a second reference voltage rail, wherein a second main conducting node of each of the third and fourth transistors is coupled to the amplifier, the third and fourth transistors being configured to have different threshold voltages from each other and a different rate of variation of their threshold voltages with respect to at least one of process and temperature variations.

5. The PVT detection circuit of claim 3, further comprising the third and fourth transistors of claim 4, wherein the first inverter is coupled to the second voltage rail via the second main conducting node of the third transistor, and the second inverter is coupled to the second voltage rail via the second main conducting node of the fourth transistor.

6. The PVT detection circuit of claim 1, wherein the first and second transistors are configured to be different from each other in one or more of the following aspects:
   the transistor length;
   the transistor width;
   the transistor type; and
   the level of the body biasing voltage.

7. A PVT detection system comprising:
   a first PVT detection circuit according to claim 1; and
   a second PVT detection circuit according to claim 1, wherein the first and second transistors of the first PVT detection circuit are configured to have threshold voltages that are each different from the threshold voltages of the first and second transistors of the second PVT detection circuit.

8. The PVT detection system of claim 7, wherein the first and second PVT detection circuits are coupled in series with each other, the output of the first PVT detection circuit being coupled to the control line of the second PVT detection circuit.

9. The PVT detection system of claim 8, further comprising a third PVT detection circuit according to claim 1, the third PVT detection circuit having its control line coupled to a complementary output of the first PVT detection circuit.

10. A three-dimensional circuit comprising a plurality of integrated circuit levels, wherein each of said levels comprises a PVT detection circuit according to claim 1.

11. A method for detecting a PVT point comprising:
   activating first and second transistors of a first conduction type via a control voltage applied to a control line coupled to a gate of each of the first and second transistors, wherein each of the first and second transistors has a first of its main conducting nodes coupled to a first voltage rail, and wherein the first and second transistors are configured to operate as current sources controlled by the control voltage on the control line, and the first and second transistors are configured such that the variations in their threshold voltages as a function of at least one of temperature or manufacturing process are different from each other; and
   amplifying a difference in the currents conducted by a second main conducting node of each of the first and second transistors in order to generate an output signal.

* * * * *